US008803367B2

(12) United States Patent
Sander

(10) Patent No.: US 8,803,367 B2
(45) Date of Patent: Aug. 12, 2014

(54) SUB SAMPLING ELECTRICAL POWER CONVERSION

(75) Inventor: Sverker Sander, Billdal (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 660 days.

(21) Appl. No.: 13/141,317

(22) PCT Filed: Dec. 22, 2008

(86) PCT No.: PCT/SE2008/051551
§ 371 (c)(1),
(2), (4) Date: Jun. 21, 2011

(87) PCT Pub. No.: WO2010/074617
PCT Pub. Date: Jul. 1, 2010

(65) Prior Publication Data
US 2011/0254594 A1    Oct. 20, 2011

(51) Int. Cl.
*H03K 3/00* (2006.01)
(52) U.S. Cl.
USPC .......................................... 307/106
(58) Field of Classification Search
USPC .......................................... 307/106
See application file for complete search history.

(56) References Cited

U.S. PATENT DOCUMENTS

| 3,322,976 A | 5/1967 | Blank |
| 3,383,526 A | 5/1968 | Berding |
| 3,444,483 A | 5/1969 | Schulz-Du Bois |
| 4,719,429 A * | 1/1988 | Ikezi et al. ..................... 327/181 |
| 6,781,405 B2 * | 8/2004 | Rajan et al. ..................... 326/30 |
| 8,174,247 B2 * | 5/2012 | Sander ........................... 323/225 |
| 2004/0183566 A1 * | 9/2004 | Svensson et al. ............... 326/30 |
| 2011/0267142 A1 * | 11/2011 | Wismar ......................... 330/129 |

FOREIGN PATENT DOCUMENTS

| GB | 975911 A | 11/1964 |
| WO | 2008051119 A1 | 5/2008 |

OTHER PUBLICATIONS

Djukic et al., "A Planar 4.5-GHz DC-DC Power Converter, IEEE Transactions on Microwave Theory and Techniques," vol. 47, No. 8, Aug. 1999, p. 1457-1460.

* cited by examiner

*Primary Examiner* — Jared Fureman
*Assistant Examiner* — Duc M Pham
(74) *Attorney, Agent, or Firm* — Rothwell, Figg, Ernst & Manbeck, P.C.

(57) ABSTRACT

The present invention relates to a solution for electrical power conversion using a first gate (202, 302) for starting an electrical wave in a wave propagating medium (205, 306) acting as a transmission delay where an electrical wave propagates and due to reflections in the propagating medium a resulting wave builds up and is transferred to an output for delivering a power amplifier, DC/DC converter or similar function and the output is controlled using a second gate (204, 304).

15 Claims, 12 Drawing Sheets

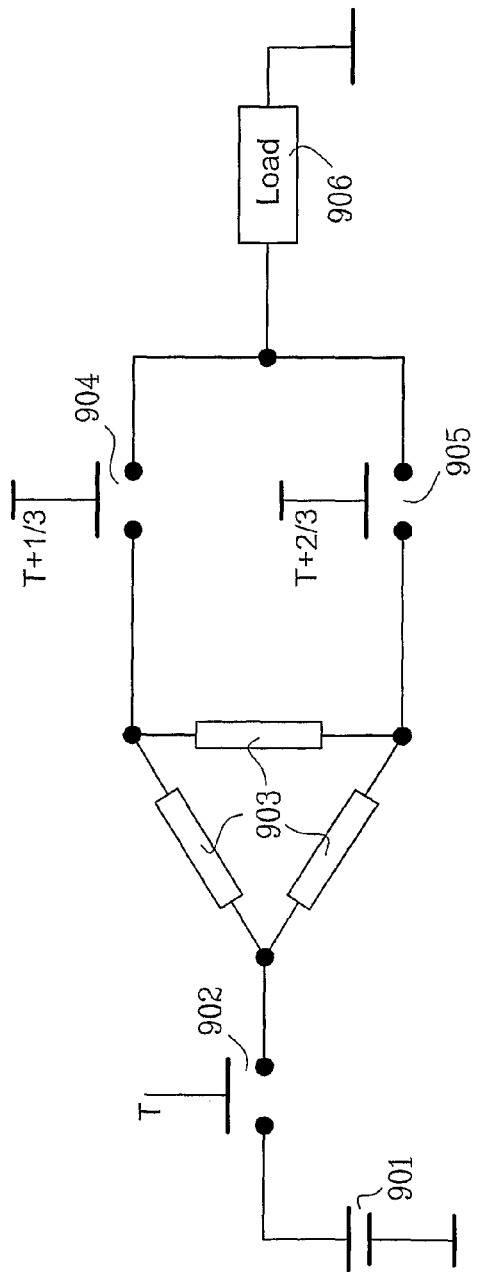
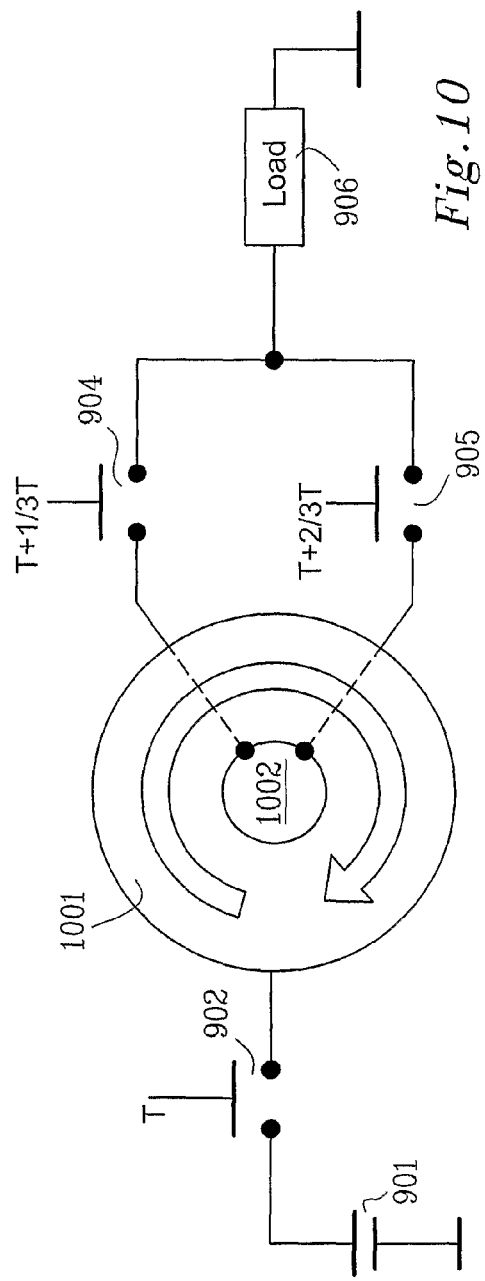

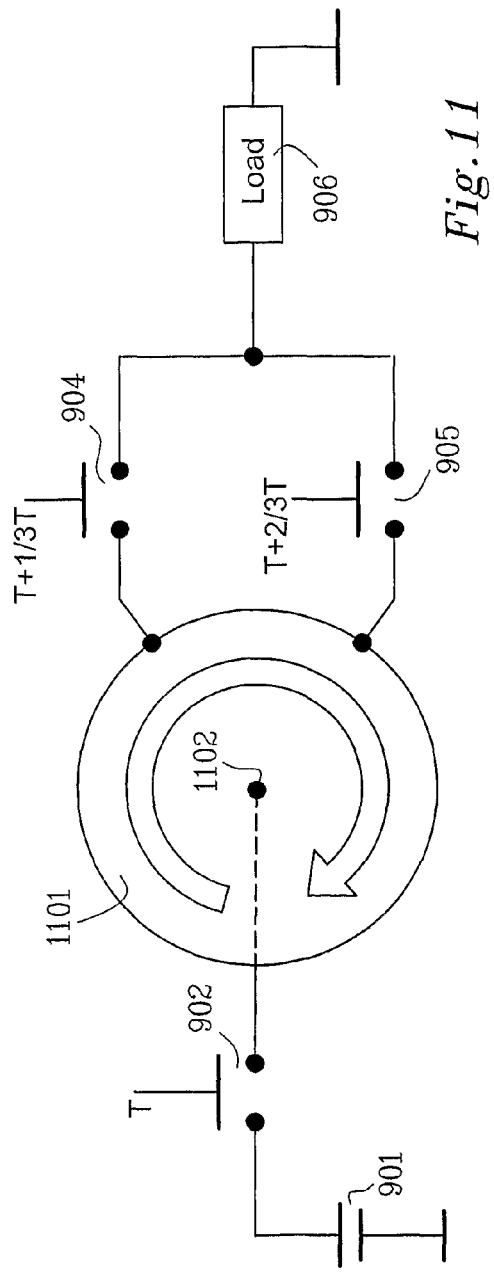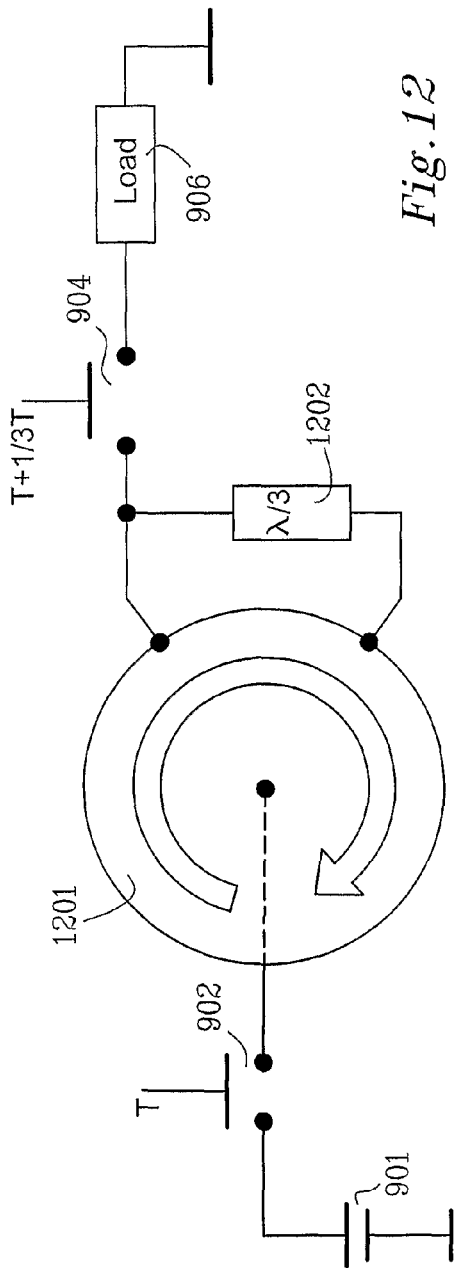

SUB SAMPLING ELECTRICAL POWER CONVERSION

CROSS REFERENCE TO RELATED APPLICATION(S)

This application is a 35 U.S.C. §371 National Phase Entry Application from PCT/SE2008/051551, filed Dec. 22, 2008, and designating the United States, the disclosure of which is incorporated herein in its entirety by reference.

TECHNICAL FIELD

The present invention relates to a solution for electrical power conversion using an electrical transmission line, plane or volume.

BACKGROUND OF THE INVENTION

Several different solutions exist in order to provide a suitable voltage to an electrical circuit, both as supply voltage and as voltage input to the circuit. Often a DC/DC converter is used to convert a fixed level to another level (step up or step down). Similarly AC/CD converters are used to convert an AC voltage to DC voltage at a certain level.

It is known to use an electrical transmission line for generating electrical pulses of high voltages or for DC/DC voltage conversion in a switching manner using short pulses traveling in the transmission line and synchronizing switches to perform the DC/DC voltage conversion. This is known for example through WO2008/051119.

The use of conventional DC/DC voltage converters can sometimes be problematic due to response times and cost considerations. In high frequency applications such components need to be highly optimized to function properly. There is also an increasing demand on suppliers of high frequency equipment for cost reductions at all levels, e.g. in the telecommunications industry cost reductions and efficiency optimization is a strong market driver.

Furthermore, this is also true for amplifiers in high frequency applications.

Depending on circuitry configuration and applications the above mentioned solutions may sometimes not be optimal and alternative solutions may be better suited. Furthermore, there exist many applications within high frequency applications where solutions for different types of power conversion types may find applicability.

Different types of electrical/communication configurations may require a plurality of different types of solutions within the same circuitry and in different modules interoperating with each other, there different types of solutions are not always compatible with each other and require different types of knowledge basis.

Radio frequency applications pose a complex situation in order to provide a working solution for transferring electrical signals/power to/from functions in such applications.

SUMMARY OF THE INVENTION

It is an object to remedy at least some of the problems mentioned above and this is provided through a number of aspects of the present invention which will be described below.

The present invention describes an alternative way of converting electrical energy of certain form factors (voltage, current, impedance) into another set of form factors. This is done by taking full advantage of the characteristics of wave propagation in a transmission line (or multi dimensional resonator such as area or volume) element.

By inserting a low ohmic voltage source as a unit step (very high $\partial v/\partial t$) at the "input" connection point of the resonator an EM wave propagation is initiated. The step rise time should be considerably less than td/2, where td is the wave propagation time for the fundamental (full length) of the resonator. The resonator is characterized by a network (in 1, 2 or 3 dim) distribution of inductive, capacitive and loss elements formed as individual components, or as finite or infinite numbers of connected physical matter that form a resonator with a characteristic impedance; for example a coaxial cable or a strip line. In the opposite "output" connection of the resonator the wave will be partly reflected as set by the degree of mismatch between the output impedance and transmission line impedance (ideally $\Gamma=-1$). This reflected wave will return in the resonator in the same phase as the original wave. As long as the input source impedance is maintained low (lower than the characteristic impedance of the resonator) yet another reflective wave will occur due to the mismatch of the resonator "input" and source impedance, thus summing up the amplitudes of the 2 waves. In this way the energy stored in the resonator will increase as long as the input (or unit step) pulse remains. Evidently due to resonator losses some energy will be lost.

When the electric form factor in the resonator reaches the requested level the resonator energy may be drained partly in free wheel mode (analogous to a buck DC/DC converter free wheel mode) or totally by changing or matching the "output" load impedance so that a controlled reflection occurs or no longer reflection occurs.

Then the process may be restarted.

The present invention is based upon 2 ideas.
1. The use of transmission line characteristics (wave propagation in a resonator) in the power converter area for resonant energy storage.
2. By "sub sampling" the system, i.e. input pulses are longer than 2td the propagation time T the electrical form factor may be converted without extensive input source switching.

Based on the ideas above several sub sequenced ideas follows:
1. The resonator might be of any physical form as described in any other literature.
2. The sub sampling method decreases the switching losses of the input source, by remaining closed for a number of T cycles.
3. The system will have 2 well defined ripple frequency sources
  a. The resonator fundamental
  b. The switching frequency of the sub sampled input source and related harmonics
4. Different resonator characteristics may be used to adopt the converter systems into any suitable load impedance.
5. Existing layout might be described as a resonator and used for energy storage.
6. DC/DC conversion (e.g. buck-boost converter), matched amplifier and radio carrier generator with microwave mixer like functions may be merged by using one common transmission line By the use of several resonators in combination impedance changes (transformers) and new resonator elements may be formed.

The solution for power conversion according to the present invention as shown in in this document and in the claims has the advantage of being able to use low cost components and provides a quick response system as compared to conventional inductor/capacitor based solutions.

A first aspect of the present invention, an electrical power conversion device is provided, comprising
  at least one electrical source input;
  at least two electrical gates;
  at least one electrical wave propagation medium; and
  at least one electrical output connectable to a receiving output load;
wherein a voltage from the electrical source is applied to the electrical wave propagation medium through a first gate for a time duration exceeding the wave propagation time through the electrical wave propagation medium to one end of the electrical wave propagation medium and back to the electrical source, i.e. $2t_d$, accumulating an electrical wave travelling in the electrical wave propagation medium and the resulting accumulated electrical wave is controlled at the electrical output with a second gate and where the first and second gates are in a conducting position substantially separated from each other in time.

The first and second gates may both be located on the electrical source side of the electrical wave propagation medium.

The device may be a power amplifier, a DC/DC converter, AC/DC converter, or DC/AC converter, or a radio transmitter with carrier wave generation and mixer.

The device may be a modulated amplifier comprising a plurality of electrical inputs each controlled by a corresponding gate connected to the electrical wave propagation medium.

The second gate is in an on (conducting) state shorter than $2t_d$.

The electrical wave propagation medium may comprise at least one of a transmission line, a micro strip line, a printed circuit board track, or a substantially circular electrically conducting disc.

The receiving output load and the electrical output of the device have substantially matched impedances. The receiving output load and the electrical output of the device have mismatched impedances.

The gate may be one of an electrical switch or a diode.

The device may further comprise a third gate arranged to provide polarity change of the electrical wave propagating in the device.

A second aspect of the present invention, a method converting an electrical power using an electrical wave propagation medium is provided, comprising the steps of:
  providing an electrical source to the electrical wave propagation medium using a first gate;
  providing the electrical source during a time exceeding the wave propagation time of the resulting electrical wave travelling in the electrical wave propagation medium to one end and back to the electrical source;
  controlling the resulting electrical wave at an electrical output using a second gate;
  wherein the first and second gates are in an on position substantially separated from each other in time.

These and other aspects of the invention will be apparent from and elucidated with reference to the embodiments described hereinafter.

BRIEF DESCRIPTION OF THE DRAWINGS

The present invention will hereinafter be explained in greater detail by means of non-limiting examples and with reference to the appended drawings in which:

FIG. 9 illustrates schematically an embodiment of the present invention: a circular biased resonator as transformer;

FIG. 10 illustrates schematically an embodiment of the present invention: a surface circular biased resonator as transformer;

FIG. 11 illustrates schematically an embodiment of the present invention: a surface circular biased resonator as transformer;

FIG. 12 illustrates schematically an embodiment of the present invention: a surface circular biased resonator as transformer;

DETAILED DESCRIPTION OF PREFERRED EMBODIMENTS

Figure 1:
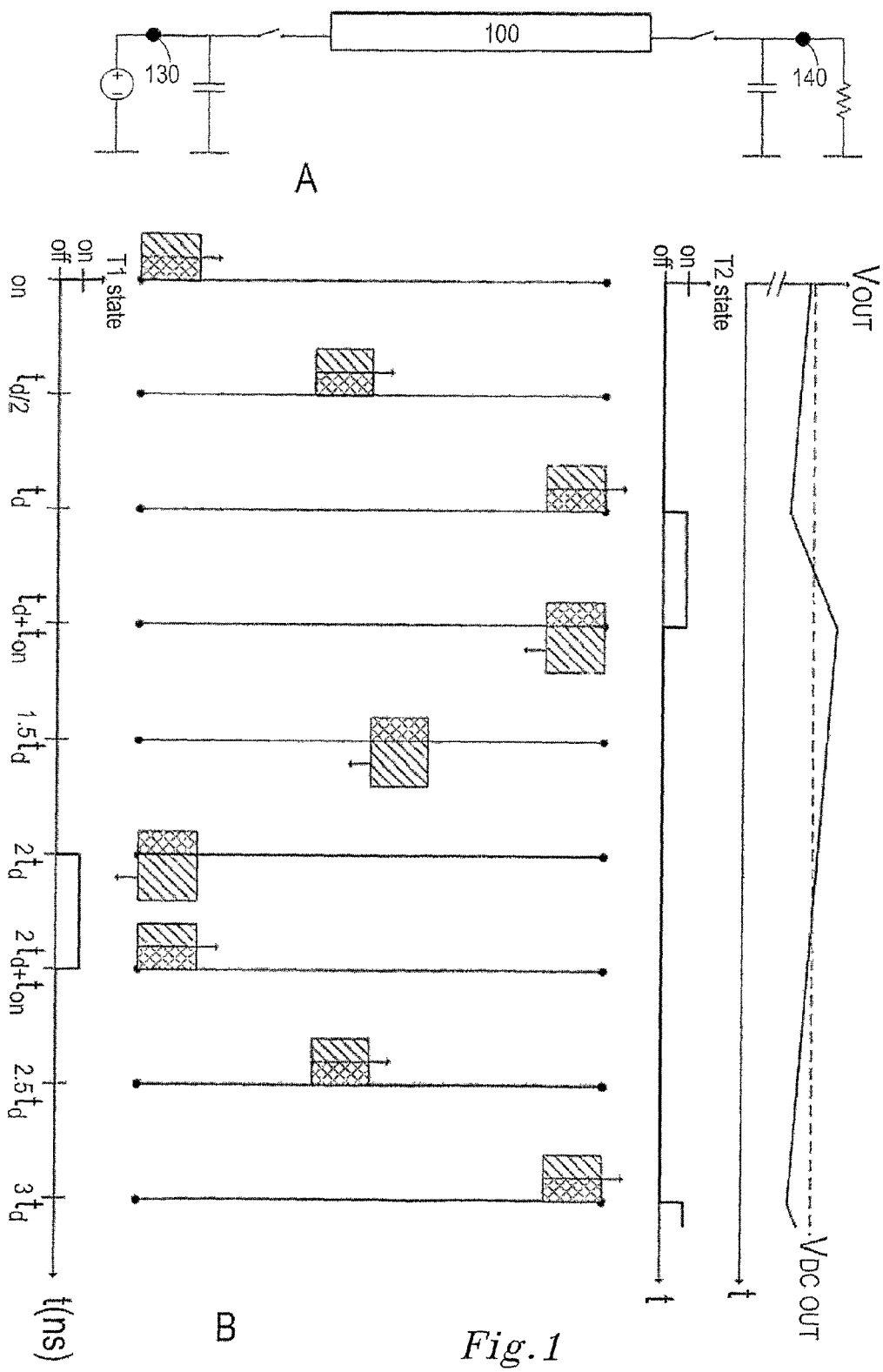
FIG. 1 illustrates schematically a circuit and timing diagram of propagation of an electrical wave according to the present invention.

The present invention relates to different electrical power conversions of electrical energy in an electrical circuit using a wave propagation medium, such as a transmission (delay) line or similar electrical transmission delay paths, such as a lumped transmission line, a strip line, a micro strip, a PCB track, and so on, and properties of impedance mismatch in relation to the transmission line/path. When an electrical wave is transmitted in a transmission line/path and encounters an impedance mismatch at least part of the electrical wave is reflected back into the transmission line/path. This is illustrated in FIG. 1A, where a step-down DC/DC circuit is shown. In the figure the input voltage $V_{DC\ IN}$ is stepped down to voltage $V_{DC\ OUT}$. The operating principle of the circuit in FIG. 1A will be explained later.

In this embodiment, T1 and T2 are transistor switches and the transmission line 100 is used as an energy storage medium. Capacitor $C_{IN}$ is used as a low impedance source for the transmission line 100 and capacitor $C_{OUT}$ holds the output voltage when no energy is supplied from the transmission line. $R_{LOAD}$ is the resistive part of the load impedance representing a consumer of the output voltage. Also, the dots with the reference numbers, 130 and 140 respectively, represent the input and output voltage terminals for the electric circuit in FIG. 1A. The input voltage $V_{DC\ IN}$ at the input voltage terminal 130 may be supplied by a DC voltage source, such as illustrated in FIG. 1A or simply be present at the input voltage terminal 130.

Now, using the time diagram of FIG. 1B the operating principle of the step-down circuit in FIG. 1A will be described.

The filled box represents the amplitude of the voltage and the current wave and the arrow the direction of travel for the voltage and current waves, while the line on which the current wave is shown represents the zero voltage and current level. The hatched part of the box stands for the voltage wave, while the crosshatching of the other part of the box stands for the current wave. It should be pointed out that the height of the hatched box is twice as high as the height of the box with crosshatching, thus while the current may for example be 1 A, the voltage is for example 2 V.

The time axes for the transistors T1 (below the time diagram) and T2 (above the time diagram) describe the switching state of each transistor. Above the time axis for T2, a voltage versus time graph is shown illustrating the output voltage $V_{OUT}$ as a function of time. However, the voltage $V_{OUT}$ is shown when the circuit in FIG. 1A has reached a steady state. The dashed line in the voltage-time graph represents a constant mean value $V_{DC\ OUT}$ of the output voltage. Using the two time axes for the transistors T1 and T2 the change in the output voltage $V_{OUT}$ may be readily observed.

In the following a method of switching the two transistors according to the present invention will be explained in detail using the time diagram in FIG. 1B. Here, the startup and steady state phase for the voltage and current in the circuit will be explained. At time t=0, the first transistor T1 is briefly turned on and off producing a voltage wave and an associated current wave of duration $t_{on}$ which propagate through the transmission line 100 towards the load $R_{LOAD}$. The second transistor T2 is still turned off. At time instant t=$t_d$/2, where $t_d$ is the signal propagation time delay for one transmission line path length, the voltage and current waves have reached halfway into the transmission line, while T2 is still turned off. Here, the transmission line is acting as energy storage for the power sent into it by the transistor T1.

Next, at the time instant t=$t_d$, the voltage and current wave will have arrived at the transistor T2. At that instant the transistor T2 is turned on for a time duration $t_{on}$ letting power be delivered to the output capacitor $C_{OUT}$ which in turn gradually discharges part of the stored energy into the load $R_{LOAD}$. This leads to an increase of the voltage across capacitor $C_{OUT}$ which is the output voltage $V_{OUT}$. It may be mentioned that the capacitance $C_{OUT}$ is part of the DC-DC-converter and that an embodiment of the invention with only an example with a resistive load $R_{LOAD}$ is shown. The load may equally be both reactive and resistive. It may also be mentioned here that several methods may be employed to turn on the transistor T2. T2 may be either externally turned on by a driver circuit after time t=$t_d$ or it may be turned on by the current wave itself. In this case the average value of the current should be designed to be sufficient in order to turn the transistor on. Also, the turning on of T2 may be followed by a synchronous turning off of T1. Transistor T2 may also be replaced with a diode rendering the need for a turn-on signal for the gate of transistor T2 unnecessary.

Now, due to the impedance mismatch between the characteristic impedance of the transmission line 100 and the impedance of the output capacitor $C_{OUT}$ and load resistance $R_{LOAD}$, the major part of the voltage and current waves will be reflected back into the transmission line 100. Thereafter, at time instant t=$t_d$+$t_{on}$, when the reflected voltage and current waves have just passed transistor T2, T2 is turned off. In the time diagram in FIG. 1B, the hatched box representing of the voltage wave is inverted, while the sign of the current wave is unchanged. This may be explained by the fact that at high frequencies, such as microwave frequencies, a capacitor acts more or less as a short circuit and thus the transmission line will be shorted at its output end. As is known to the skilled person, a voltage wave will have the opposite sign when "reflected" from a short circuited transmission line while the current wave will have an unchanged sign. It may also be added here, that the amplitudes of the reflected voltage and current waves will be less than those of the original voltage and current waves sent into the transmission line, due to the fact that a part of the power is delivered to the output capacitor $C_{OUT}$ and load resistance $R_{LOAD}$. Also, when, T2 is turned off, the output voltage $V_{OUT}$ will start to decrease due to the discharge of the capacitor into the load resistance $R_{LOAD}$. At time instant t=1.5$t_d$ the voltage and current wave has traveled halfway back into the transmission line towards the transistor T1. At this instant both transistors T1 and T2 are turned off and the transmission line 100 is exhibiting its energy storing function again.

Next, at the time instant t=2$t_d$ when the voltage and current waves have reached the transistor T1, T1 is turned on again, producing a second voltage wave and a second current wave propagating into the transmission line 100. T1 is also held turned on for a time duration $t_{on}$ as shown in the time graph for T1 in FIG. 1B. The reflected first voltage and current waves will then pass the transistor T1 and be reflected back into the transmission line 100 due to the impedance mismatch between the characteristic impedance of the transmission line and the impedance of the capacitor $C_{IN}$. Since the input capacitor $C_{IN}$ acts as a short circuit at high frequencies in the same way as the output capacitor $C_{OUT}$ the voltage wave will be reflected from capacitor $C_{IN}$ and change its sign, while the current wave will also be reflected, but without any sign change. This is illustrated in FIG. 1B at the time instant T=2$t_d$+$t_{on}$ as the inverted voltage wave represented by the hatched box. The result of a first voltage wave and a first current wave traveling in the same direction to the output end of the transmission line 100 as the second voltage wave and a second current wave producing by the turning on off transistor T1 results in a superposition of the two voltage and current waves and therefore to an increase in the amplitude of both the voltage and the current wave (not shown) traveling in the transmission line.

At time instant t=2.5 $t_d$ the new superposed voltage and current wave is illustrated as having arrived halfway through the transmission line 100. This superposed voltage and current wave will have arrived at the second transistor T2 at the time instant t=3 $t_d$ at which instant the second transistor T2 is turned on for a time duration $t_{on}$ (not shown).

Again, one part of the superposed current wave will be dissipated into charging output capacitor $C_{OUT}$, which will lead to an increase of the output voltage $V_{OUT}$ with respect to the voltage level in the previous charging cycle of the load capacitance, while a larger part of the current wave will be reflected back into the transmission line 100. The discharge of the output capacitor $C_{OUT}$ towards the load $R_{LOAD}$ during the time the reflected voltage and current waves propagate in the transmission line will lead to a renewed decrease in the output voltage $V_{OUT}$.

During each subsequent repetition of the process of switching the transistors T1 and T2 described above, the output voltage $V_{OUT}$ will be stepped up until it has reached a steady state. This will be the case after a number of switching cycles for T1 and T2, when the current charging capacitor $C_{OUT}$ equals the discharge current supplying the load resistor $R_{LOAD}$. In this steady state the output voltage $V_{DC\ OUT}$ will vary slightly around an average DC voltage located between zero voltage and the input voltage $V_{DC\ IN}$, i.e. $0<V_{DC\ OUT}<V_{DC\ IN}$. The output DC voltage is held constant by adjusting the $t_{on}$ time when $R_{LOAD}$ is varying by using a conventional feedback loop (ordinary Pulse Width Modulation, PWM).

It may be also mentioned that the second transistor may be replaced by a rectifier diode, which will change the situation for the output voltage somewhat.

At t=0, when the first switch T1 is turned on, the output voltage across capacitor $C_{OUT}$ will be zero. Then, for each switching cycle, the output voltage $V_{OUT}$ will increase, since capacitor $C_{OUT}$ will be charged by current pulses from the transmission line until a steady-state has been reached for the output voltage $V_{DC\ OUT}$ which will have roughly the same value as in the case where T2 was a transistor switch.

The use of short pulses switched by T1 and T2 may be considered to be a procedure described as an over sampling (OVS) procedure.

In the present invention the first switch T1 has an on time considerably longer than the transmission time $t_d$ through the transmission line/path, e.g. $T_{on} \geq 2t_d$, this procedure may be described as a sub sampling (SUS) procedure.

The SUS effect, optionally together with OVS techniques, and together with suitable electrical components may be utilized for performing different types of electrical power conversions finding applicability as for instance in a:
1. Buck converter SUS
2. Pulsed power amplifier SUS/OVS
3. Waveform generator SUS or a bit controlled DC/DC converter/amplifier
4. Continuous power amplifier SUS/OVS
5. Boost converter SUS
6. Radio transmitter with switch mode generated carrier SUS/OVS Some of the above mentioned applications include a combination of SUS and OVS based procedures.

Figure 2:
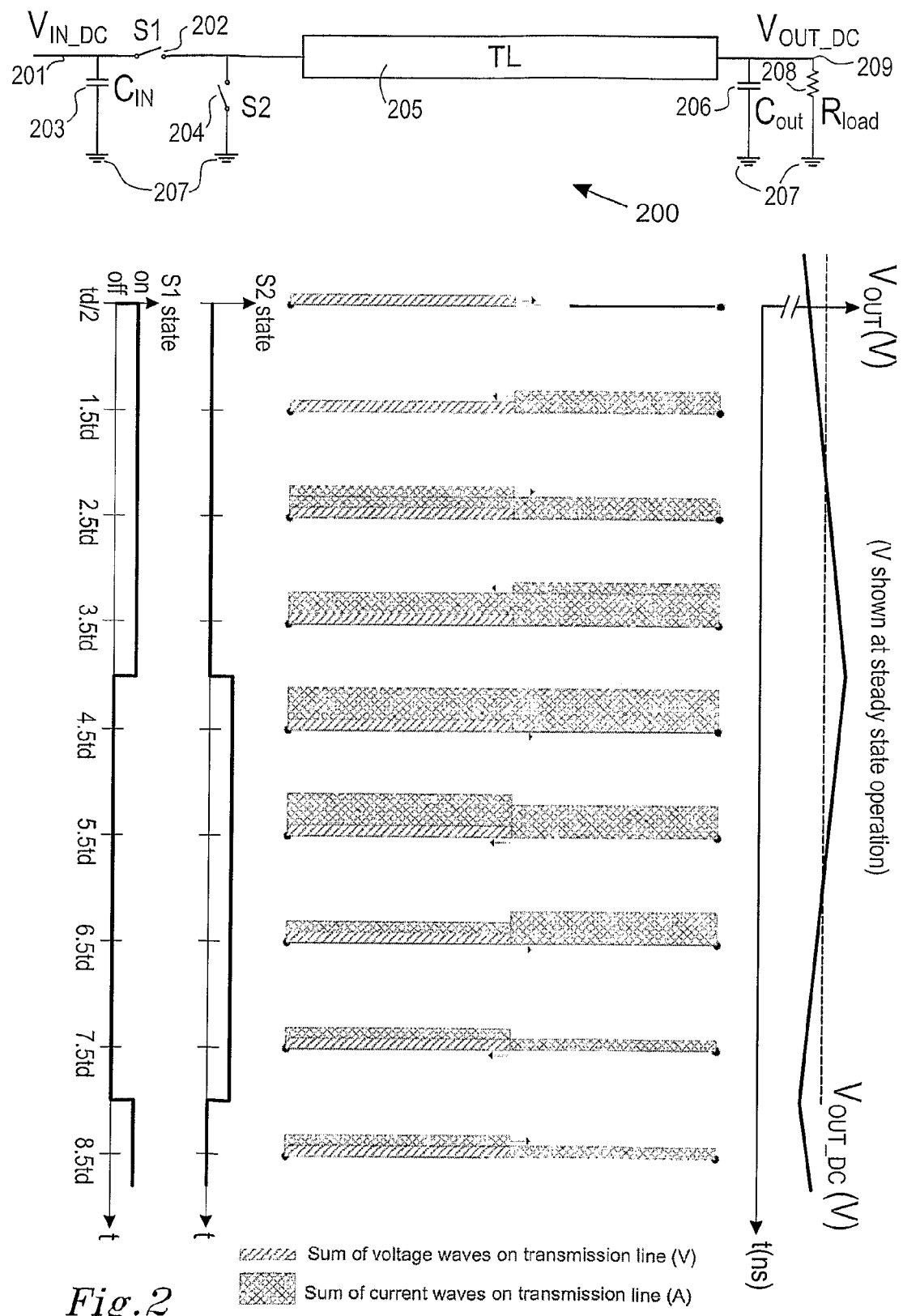
FIG. 2 illustrates schematically a circuit and timing diagram of propagation of an electrical wave according to an embodiment of the present invention.

A circuit according to the present invention for providing a buck converter 200 is illustrated in FIG. 2. The circuit comprises a voltage source 201, an input capacitance Cin 203, a first electrical gate, e.g. a switch, S1 202, S1 is connected to a second electrical gate, e.g. switch, S2 204 operating in parallel to a transmission line TL 205 in turn connected to an output capacitance Cout 206 and an output connection to a load Rload 208. The input capacitance Cin 230, the second switch S2 204, the output capacitance Cout 206 and the load Rload 208 are all connected to ground 207.

The operation of this embodiment is as follows:

An operation cycle at start up is shown in FIG. 2 and is described with text below:

t=0

Switch S1 202 is turned on. A positive current (cross hatched) and voltage wave (hatched) propagates into the transmission line 205.

t=1.5td

Since the reflection coefficient Γ is near but not equal to −1 at the transmission line 205 far end the waves will be partially reflected. The current wave will be reflected with unchanged sign while the voltage wave will change polarity. The waves will propagate towards the transmission line input end. During this state the output voltage VOUT will increase.

t=2.5td

Since the reflection coefficient Γ is approximately −1 at the transmission line 205 input end (CIN 203 is large and has very low impedance at f=1/T) the voltage wave is reflected in CIN 203 and changes polarity once again. The input current that flows through switch S1 202 is increased in discrete amplitude steps at t=2td, 4td, 6td and so on. Switch S1 202 is maintained on until wanted duty cycle pulse width is obtained. During this state the SUS technique described earlier is used.

t=4td

Switch S1 202 is turned off and switch S2 204 on. The accumulated energy in the transmission line 205 will now free wheel in switch S2 204 as in a conventional buck converter.

t=4.5td

The waves are still reflected at the transmission line 205 input end. However no new energy is supplied through switch S1 202 and the current in the transmission line 205 will decrease in discrete steps.

During this state the output voltage VOUT will decrease.

t=8td

Switch S1 202 is turned on again and switch S2 204 is turned off. A new operation cycle starts.

At steady state operation, when PIN+PLOSS=POUT, the output voltage VOUT will fluctuate around a DC output voltage level VOUT_DC 209.

Figure 3:
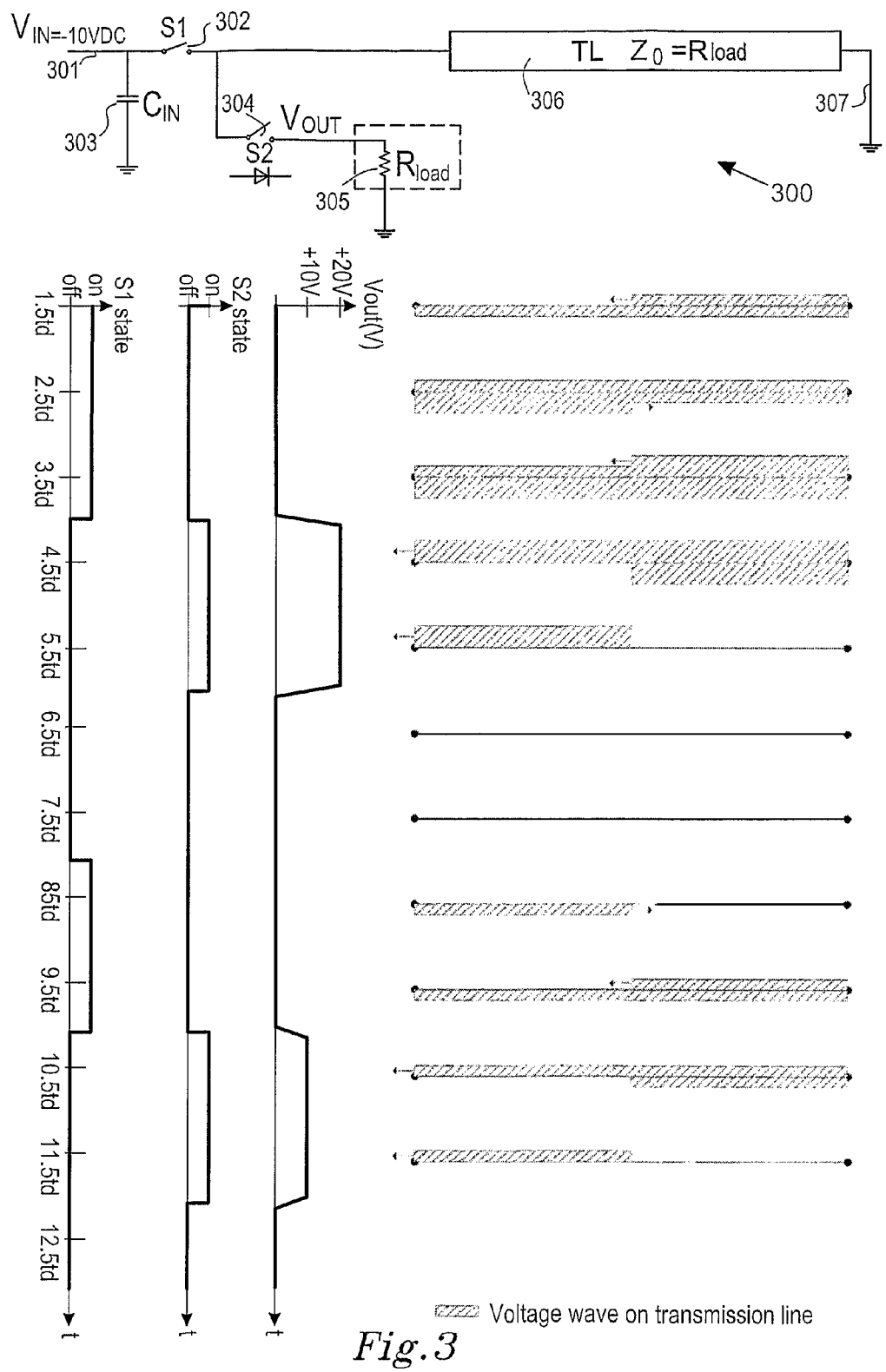
FIG. 3 illustrates schematically a circuit and timing diagram of propagation of an electrical wave according to an embodiment of the present invention.

A circuit according to the present invention for providing a buck-boost derived pulsed power amplifier 300 is shown in FIG. 3. The circuit comprises a voltage source 301 in with an optional Cin 303. A first switch S1 302 controls the voltage source connection to a transmission line TL 306 in turn connected to ground 307 at the other end of the transmission line 306. On the voltage source side of the transmission line 306 a second switch S2 304 is connected in parallel for controlling voltage output towards a load (Rload 305); optionally the switch S2 304 may be interchanged with a suitable diode which will also operate as an electrical gate. The operation of this embodiment is as follows.

In this circuit the transmission line 306 impedance is matched to the load when S2 304 switch is in an on state. The matched output makes it possible to totally empty the energy stored in the transmission line 306 during a time interval of 2td.

The first cycle shown in FIG. 3 is described below:

at t=0

Switch S1 302 is turned on. A negative voltage wave (hatched) propagates into the transmission line 306.

t=1.5td

Since the reflection coefficient Γ is −1 at the transmission line 306 far end the voltage wave will be totally reflected, but with opposite polarity, and propagate towards the transmission line 306 input end.

t=2.5td

Since the reflection coefficient Γ is −1 at the transmission line 306 input end (CIN 303 has very low impedance at f=1/T) the voltage wave is totally reflected in CIN 303 and changes polarity once again.

The voltage wave's peak voltage is increased in VIN 301 amplitude steps at t=2td, 4td, 6td and so on. Switch S1 302 is maintained on until wanted output voltage is accumulated. During this state the SUS technique described earlier is used. This state is in analogy with the on state of a buck-boost converter.

t=4td

Switch S1 302 is turned off and switch S2 304 on. Output voltage VOUT increases to +20V over the resistance RLOAD 305 (VOUT=−VINtON/2td=−(−10)4td/2td=+20V). During this state the OVS technique described earlier in this document is used.

t=6td

All energy stored in the transmission line 306 has now been totally consumed in RLOAD 305 during a time interval of 2td.

t=8td

A new accumulation phase starts with $t_{ON}=2t_d$. (Compare it to the cycle described above.)

If just one transmission line is used the output power of the amplifier will be pulsed since no output power may be delivered to the load during the accumulation phase.

As an example this circuit may be used in a radar application where the output power of the transmitter antenna is pulsed at different power levels. In this application the load RLOAD 305 represents the impedance of a PA drain terminal. The high microwave frequency (GHz) carrier is amplitude modulated at a lower frequency by the output voltage VOUT in an Envelope, Elimination, and Restoration (EER) application.

Figure 4:
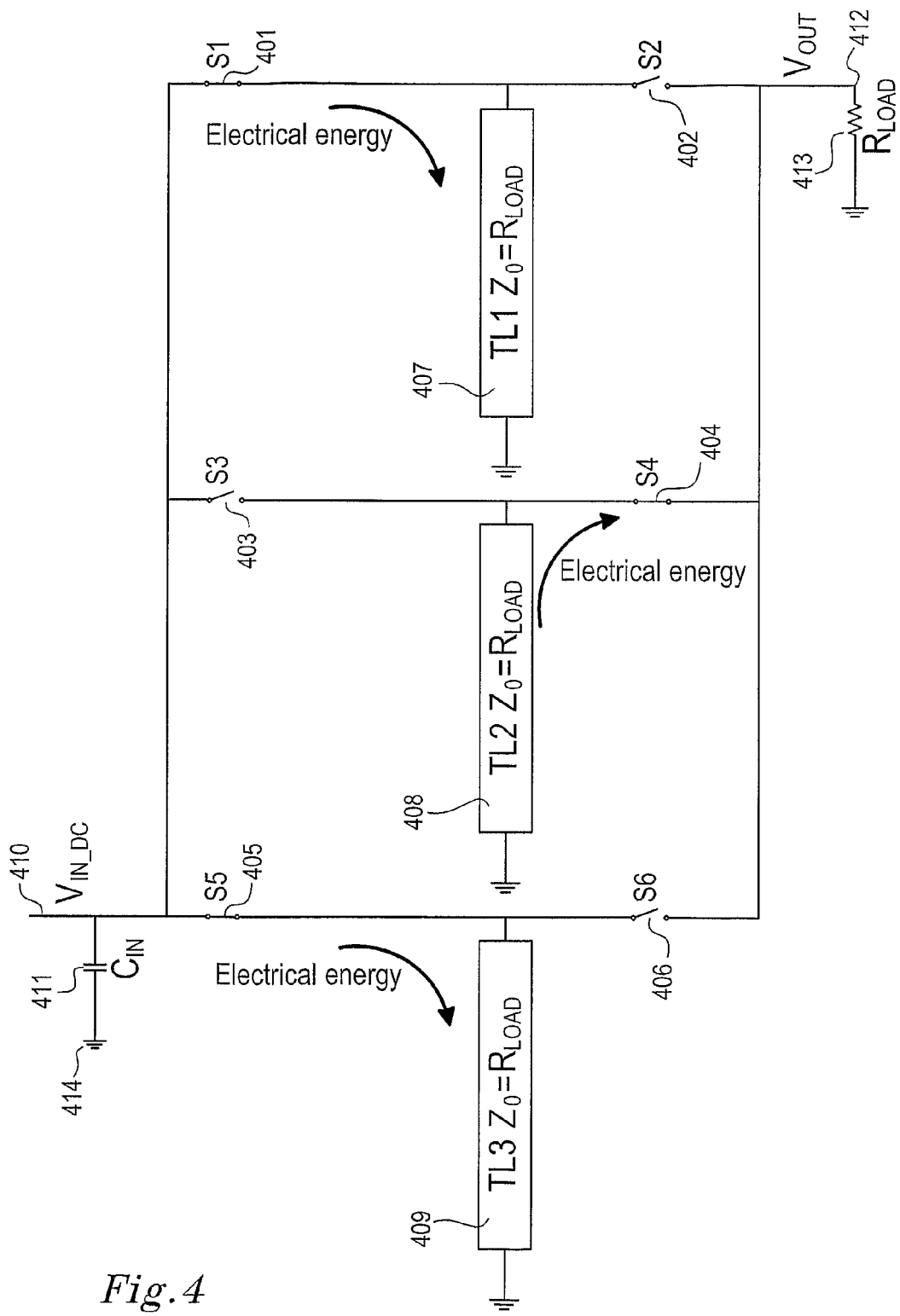
FIG. 4 illustrates schematically a circuit for a constant output power amplifier according to an embodiment of the present invention.

A variation of the pulsed power amplifier is a continuous power amplifier which may be designed using a plurality of pulsed power amplifier circuits. An example of this is shown in FIG. 4, where several transmission lines 407, 408, 409 operate in parallel. While one transmission line is feeding the load 413 with power the remaining ones are accumulating electrical energy. With suitable switching of switches S1 to S6 401, 402, 403, 404, 405, 406 continuous power amplification may be provided. A capacitance Cin 411 is connected between the input voltage Vin_dc 410 and ground 414.

Figure 5:
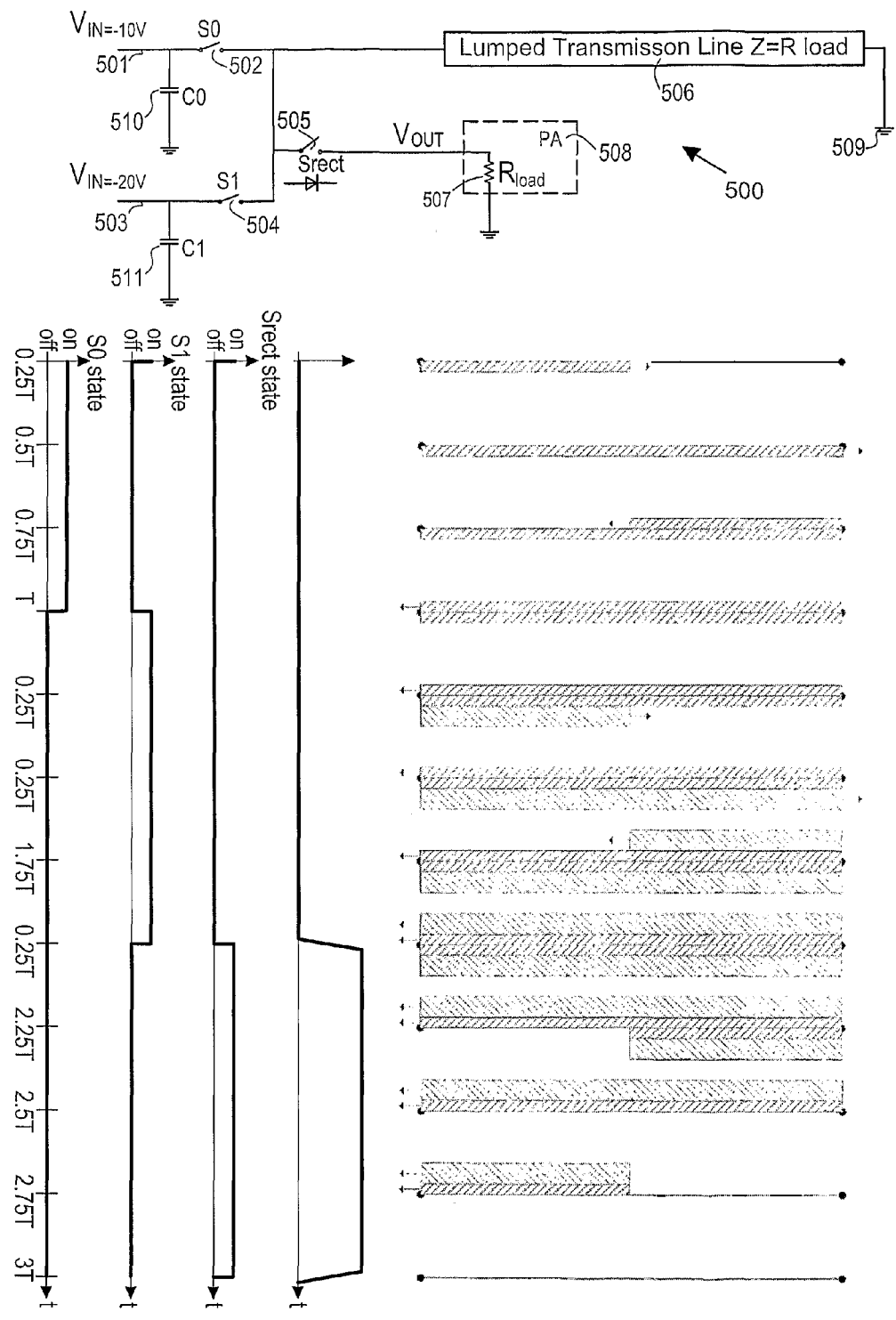
FIG. 5 illustrates schematically a circuit and timing diagram of propagation of an electrical wave according to an embodiment of the present invention.

However the pulsed power and continuous power amplifier circuits are not limited to one DC input voltage. The transmission lines may accumulate several DC voltages 501, 503 one after the other and thus provide a (bit) modulated power amplifier 500 with finer output voltage resolution as illustrated in FIG. 5.

Capacitors C0 510 and C1 511 represent output filter capacitors of two conventional step-down DC/DC converters. Switch Srect 505 is a rectifier and may be replaced with a diode. To minimize losses a single synchronous rectifier transistor should be used. Switch elements S0 502 and S1 504 has to be designed with two transistors in series because the drain-source voltage may be both positive and negative. The timing of this embodiment may be described as at:

t=0

Switch S0 502 is turned on. A negative voltage wave propagates into the Transmission Line (TL) 506. The Transmission Line (TL) is connected to ground 509.

t=0.5T

The wave reaches the short circuit end of the LTL 506. The voltage wave will change polarity since the reflection coefficient $\Gamma=-1$.

t=T

Switch S0 502 turns off and S1 504 on. A second voltage wave is accumulated on the first one. The first voltage wave changes polarity in the large capacitor C1 511 since its impedance is very low $\Gamma \approx -1$.

t=2T

S1 504 turns off and Srect 505 on. The accumulated voltage wave is consumed in Rload 507.

The technique described above may be used to reach wanted output voltage faster than with a single DC input voltage. It may also give a finer resolution of the output voltage levels.

Cascading several DC input voltages 501, 503 may for example be distributed with a falling scale (e.g. 8V, 4V, 2V, 1V) that will give 16 output voltage levels (0-15V), i.e. 4 bit amplifier. This will also make it easy to interface the amplifier to a serial binary sequence input signal. The amplifier connected to a digital system will form a high output power DA-converter.

The techniques with one accumulated input DC voltage and multiple input DC voltages described earlier may also be combined. For example every second DC input voltage can be excluded e.g. 8V, 4V, 2V, 1V can be reduced to 4V and 1V. Output voltages of 8V and 2V can then be generated by accumulation of 4V and 1V two times respectively.

Another reduction of components may also be possible if the output power probability function is studied. If the amplifier for example is used to follow a WCDMA amplitude signal it is not likely that maximum output power is required constantly. This means that there is no need for filling all transmission lines in the circuit with maximum energy and the number of transmission lines may be reduced with no signal degeneration.

Besides the Envelope Elimination and Restoration (EER) application mentioned above, where the amplifier is used to amplitude modulate a microwave frequency carrier, it may also be used to generate arbitrary waveforms feeding audio equipment or other matched loads.

This type of buck-boost derived amplifier may in a special case also be used as a DC/DC converter by setting the desired output voltage to a fixed value (e.g. +5.0 VDC). By partly mismatching or matching the transmission lines impedances $Z_0$ to load impedance, a pole in the control to output transfer function may be moved upwards in frequency or completely removed. This may render wider DC/DC converter control bandwidth and faster step response to load changes.

Figure 6:
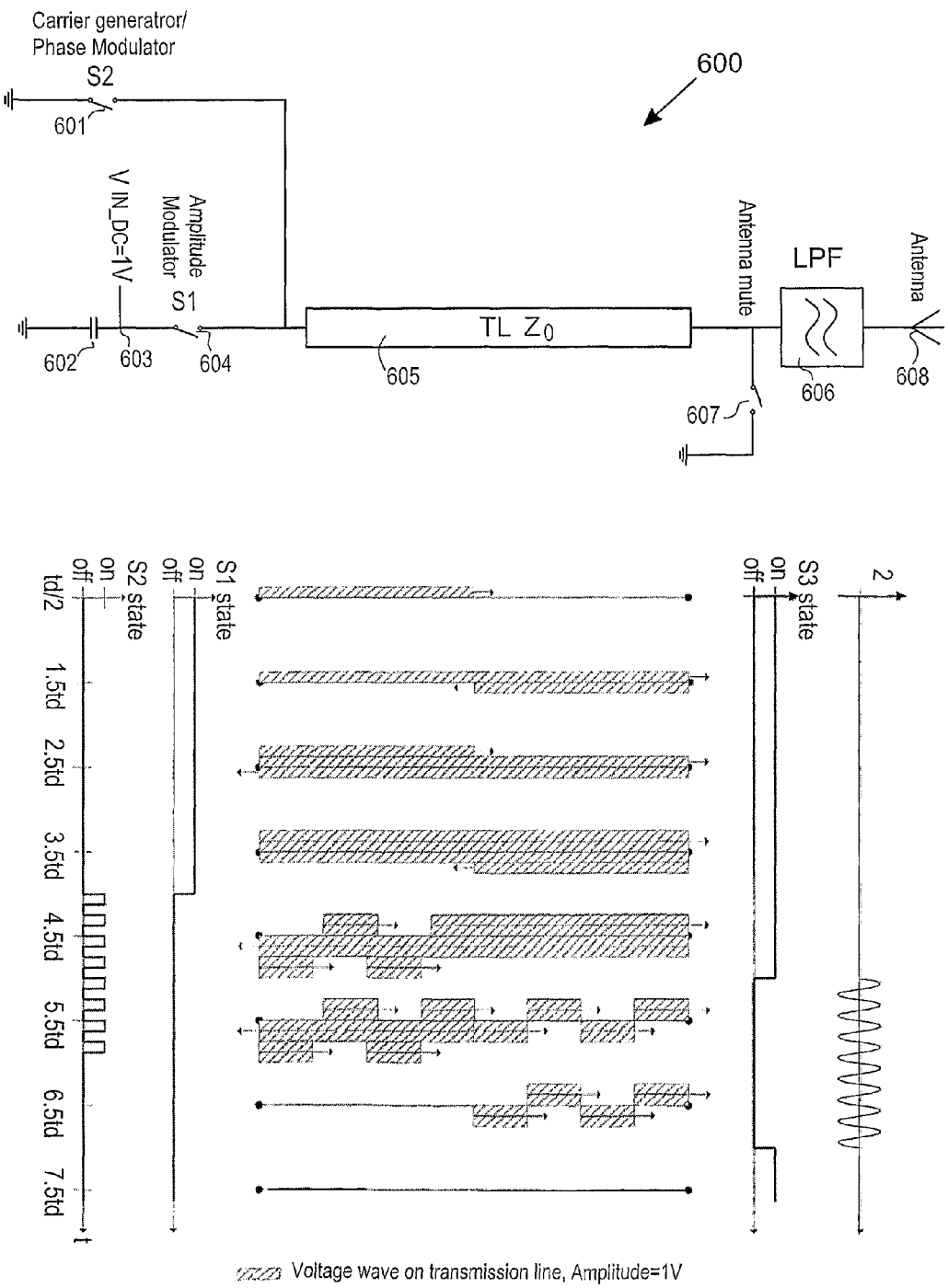
FIG. 6 illustrates schematically a circuit and timing diagram of an electrical wave in a radio transmitter embodiment.
Figure 7:
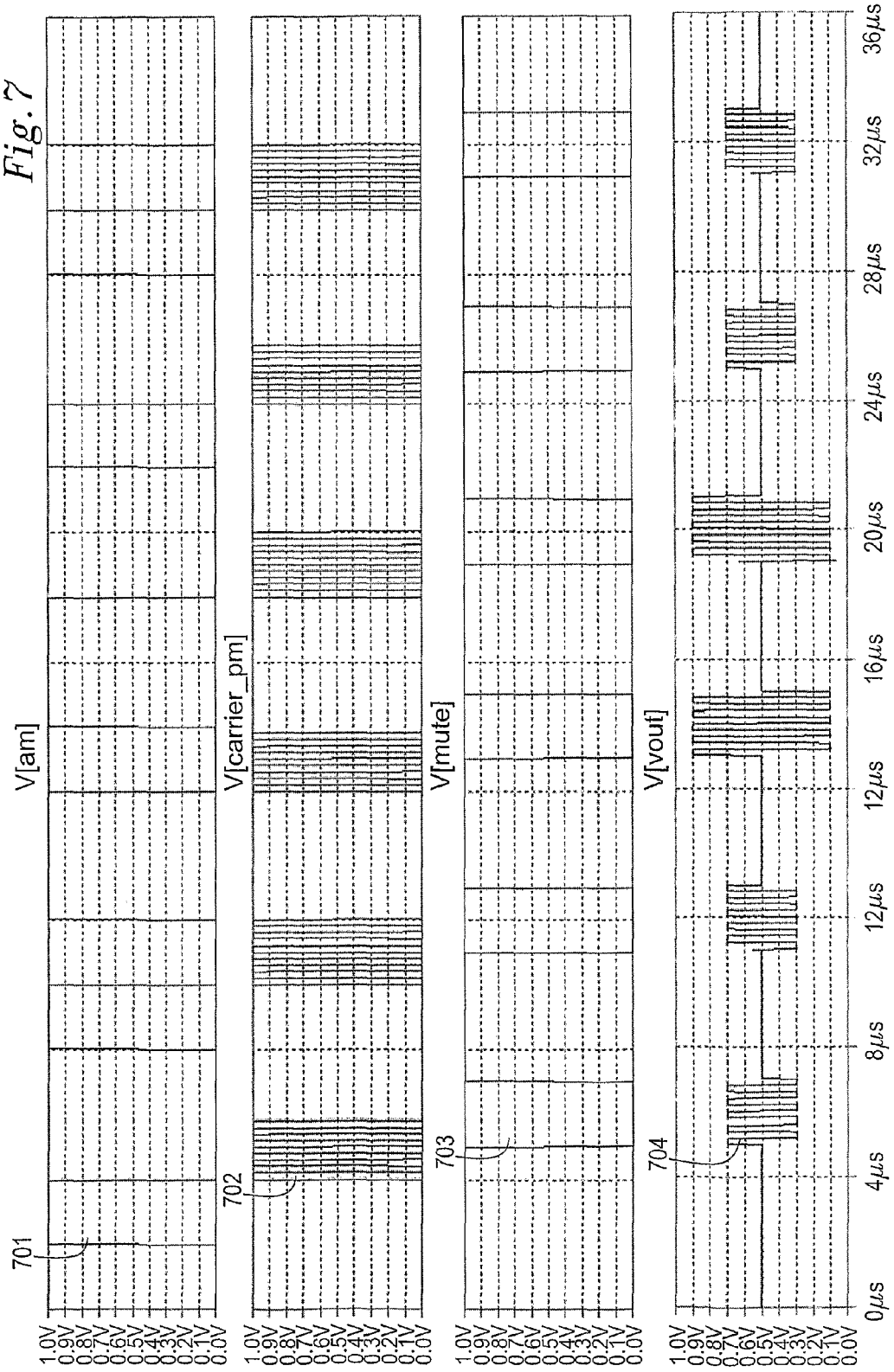
FIG. 7 illustrates schematically the timing diagram of FIG. 6 in more detail.

A radio transmitter 600 application may be found in FIG. 6 and with voltage outputs shown in FIG. 7 illustrating a pulsed power radio transmitter with switch mode generated carrier. The circuit comprise a source input 603 connected to ground via a capacitor 602. A first switch S1 604 controls the application of the source voltage to a transmission line 605 and a carrier generating/Phase modulating switch S2 601 is also connected to the transmission line. A third switch S3 607 is provided for controlling output to an antenna 608. Optionally, a low pass filter 606 may be provided before the antenna The output voltage (Vout) is fed into an antenna 608. The first four pulses corresponds to a 4 QAM data sequence (AM=1 PM=0°, AM=1 PM=180°, AM=2 PM=0°, AM=2 PM=180°). An operation cycle shown in FIG. 6 is described with text below:

At start up switch S2 601 is off and switch S3 607 is on.

Amplitude Modulation (Buck-boost on State) 701 t=0

Switch S1 604 is turned on. A positive 1V voltage wave (hatched blue) propagates into the transmission line 605.

t=1.5td

Since the reflection coefficient $\Gamma$ is −1 at the transmission line far end the 1V voltage wave will be totally reflected in the closed switch S3 607, but with opposite polarity, and propagate towards the transmission line 605 input end.

t=2.5td

Switch S1 604 is maintained on. Since the reflection coefficient $\Gamma$ is −1 at the transmission line input end (CIN 602 has very low impedance at f=1/T) the 1V voltage wave is totally reflected in CIN 602 and is consequently added to the previous voltage wave.

t=3.5td

The voltage wave is reflected a second time in switch S3 607 to get a 2V wave.

Carrier Generation/Phase Modulation (No Buck-boost Equivalent) 702 t=4.5td

Switch S1 604 has now been closed and switch S2 601 is turned on and off at a high frequency (typ. GHz) to generate a radio carrier. If switch S2 601 is on the original polarity will be kept ([+2VDC]·[+1]). If switch S2 601 is off the original polarity will be changed ([+2VDC]·[−1]).

Phase modulation is also generated during this state. The carrier phase may be shifted 180° by simply inverting the S2 601 gate signal. However finer phase displacements may be achieved by delaying the gate signal relative to a higher system clock frequency.

Transmit (Buck-boost Free Wheel State) 703 t=5.5td

The antenna mute switch S3 607 is turned off and the radio signal is fed into the antenna while switch S2 601 is still operating. The radio signal is filtered in a matched low pass filter 606 to cut off carrier square wave harmonics.

t=6td

An amplitude/phase modulated signal of 2td length has now been transmitted 704.

Generally the circuit diagram is similar to that will be discussed later in this document for DC/AC conversion (in relation to FIG. 13). During DC/AC conversion the polarity changing switch S2 601 is operated at a magnitude lower in frequency than the remaining switches. In contrary the polarity changing switch S2 601 is operated at a higher frequency than the remaining switches in the radio application described in this part.

This buck-boost derived circuit may be used to form an integrated radio system with both DC/DC conversion and microwave mixer functions. The DC input voltage VIN_DC 603 may for example be a small battery cell. If the DC voltage drops, when the battery cell gradually discharges over time, it may be compensated by maintaining switch S1 604 on longer until wanted amplitude is obtained.

Furthermore the antenna cable may be integrated in the power conversion/mixer circuit by letting both switch S1 604 (Amplitude modulator) and switch S2 601 (Carrier generator/Phase modulator) be located at the transmission line 605 input end as presented in FIG. 6.

Figure 14:
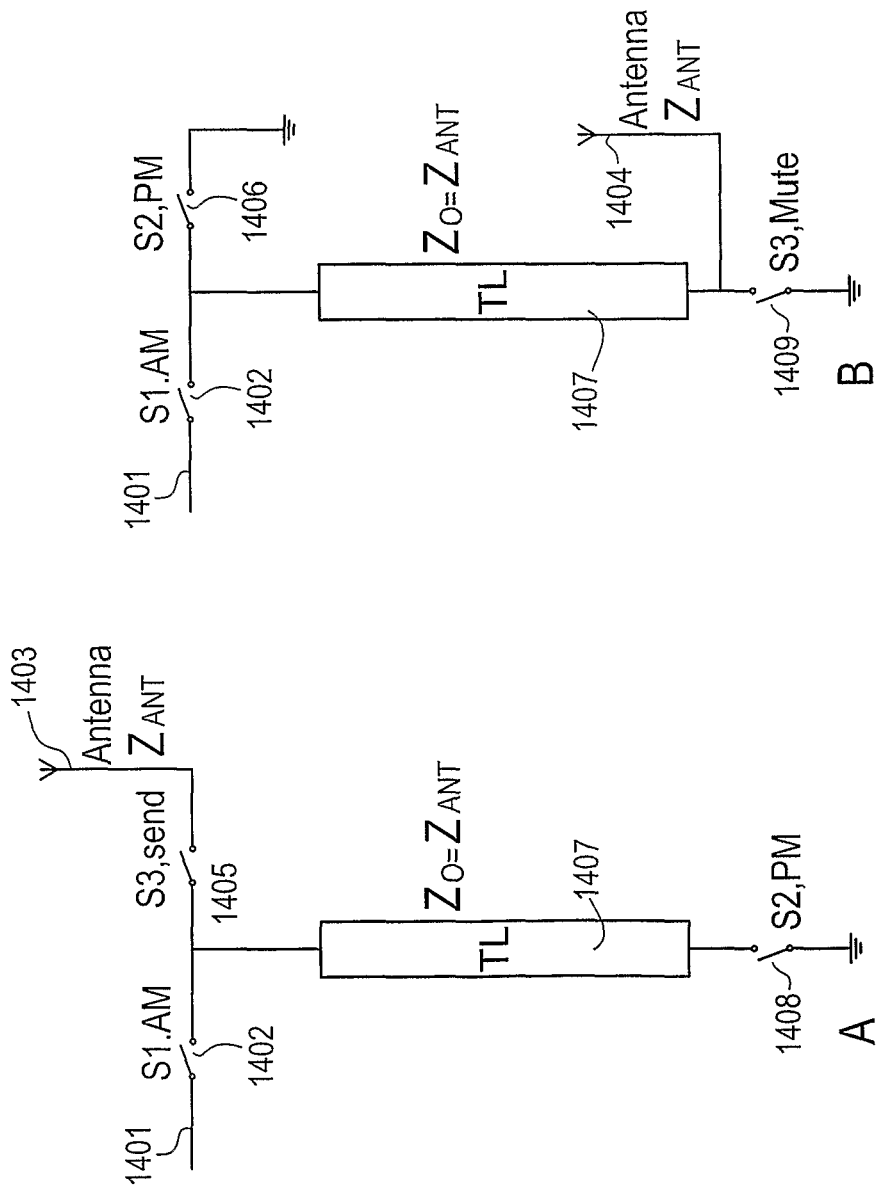
FIGS. 14 A and B illustrates schematically two embodiments of the present invention: pulsed QAM radio transmitter.

This low component count radio system may for example be used in RFID applications where size is crucial. It may also be used in other radio transmitter applications and supply high over all system efficiency since the input DC power is converted to RF power with a minimum number of switch stages. Alternatively, FIG. 14A show embodiments of a solution that enables continuous output power QAM radio transmitter. The setup shown in FIG. 14A enables paralleling of several transmission lines to obtain continuous output power. A circuit switch S1 1402 controlling a voltage source 1401 connection to a transmission line TL 1407. The transmission line 1407 is on the other side connected to a second switch S2 1408. The second switch S2 1408 is connected to ground. A third switch 1405 is connected between the transmission line 1407 and an antenna 1403. The setup shown in FIG. 14B enables use of antenna cable as an energy storing device. As in FIG. 14A, a first switch S1 1402 controls a voltage source 1401 and is connected to a transmission line 1407. A third switch S3 1409 is connected between the transmission line 1407 far side and ground. A second switch S2 is connected between the transmission line 1407 and ground on the voltage source side. The antenna 1404 is connected between the transmission line 1407 and the third switch 1409.

As already mentioned earlier a continuous output power may be achieved by connecting several transmission lines in parallel.

Several DC input voltages may also be used to reach wanted output voltage faster than with a single DC input voltage. This will also render a finer resolution of the output amplitude levels. If the DC input voltages are distributed with a falling scale (e.g. 8V, 4V, 2V, 1V) the amplitude modulator may be directly interfaced to a serial binary data sequence.

In an alternative embodiment of this radio carrier generating example, the carrier may also be generated by a controlled mismatch of transmission line impedance and antenna impedance. This will make it possible to remove the carrier generator switch in previous example. However this will possibly produce, depending on the choice of components setup, a decaying amplitude in the output pulses but with maintained amplitude information. For some applications this is sufficient to provide a suitable radio communication link between communication devices.

A solution according to the present invention may be used for providing a faster response than conventional DC/DC converter solutions, for instance for matched start up from sleep mode. The previously described transmission line buck/boost converters have properties that distinguish them from their conventional buck/boost counterparts. One is the fact that the energy storing transmission line has defined characteristic impedance that may not be found in a conventional power inductor. The characteristic impedance may be used to transfer energy very fast into or out from the transmission line. For example a lumped transmission line with an integer number N of discrete LC elements in series will have a propagation time td(s) of N$\sqrt{(LC)}$.

The fast propagation time of the voltage and current waves may be used to start up a DC/DC converter faster than if a conventional power inductor was used. This will allow the DC/DC converters to more often go to, and stay longer in, sleep mode to decrease over all system energy consumption (radio system/processor system or other type of electrical system that requires DC voltages).

In sleep mode a second transmission line is used to store the required start up energy. No voltage or current waves are moving in this state. The energy is stored as DC voltages in the transmission line's capacitive elements.

At start up a third switch connects the two transmission lines together. A voltage and a current wave will start propagating into the converter transmission line. Since the characteristic impedance is matched, all energy is transferred to the converter transmission line after a td time interval. Note that this function requires a high side switch that blocks both positive and negative voltages; for example two series coupled transistors with body diodes in opposite direction.

The ratio between output filter inductor/capacitor values will have impact of the required DC voltage charge level in the transmission line capacitive elements. If $C_{OUT}$ is large the DC voltage level has to be high. If $C_{OUT}$ is small ($X_C(f) // R_{LOAD} \approx Z_0$ @f=1/td) the DC voltage level approaches wanted output DC voltage.

A variation of the matched start up mode is a corresponding matched sleep mode. As suggested earlier the energy stored in the converter transmission line may be transferred very fast to another electrical component with matched characteristic impedance. This may also be used to shut down a DC/DC converter's output voltage. If the output filter energy may be wasted, and only the fast output voltage shut down time is required, the Lx switch node may be directly terminated with a resistance R=$Z_0$. The converter transmission line's energy will be totally drained during a td time interval i.e. a fraction of the switch frequency period time. The output filter energy may also be fed back to the input voltage source while maintaining the fast output voltage shut down time.

In steady state operation the converter transmission line is used as a conventional power inductor to filter the pulse width modulated input DC voltage. A second transmission line, with matched characteristic impedance, is separated from the first one with a third switch (or diode) during steady state operation.

Sleep Mode, Fast Transfer of Converter Transmission Line Energy

At shut down the third switch connects the two transmission lines together. A voltage and a current wave will start propagating into the second transmission line. Since the characteristic impedance is matched, all energy is transferred to the second transmission line after a td time interval. Note that this function requires a low side switch that blocks both positive and negative voltages. For example two series coupled transistors with body diodes in opposite direction.

Sleep Mode, Slow Energy Feed Back to Input Voltage Source

During this state the second transmission line energy is fed back to the input voltage source. The current free wheels in the short circuited transmission line far end. It decreases linearly due to the fixed input DC voltage. Note that it is not necessary to wait for this current to reach zero. The converter may immediately be restarted after sleep mode has been initiated. The free wheel current in the second transmission line will then be feeding both input voltage source and the converter transmission line with energy. However a second shut down is not allowed until the free wheel current has reached zero. If this is executed an unwanted wave will slip out into the converter transmission line.

The fast start up sequence described earlier may be combined with the fast sleep mode sequence. They may together be used to start up and shut down power converters (e.g. DC/DC, DC/AC, AC/DC, AC/AC . . . ) in fractions of the steady state switch frequency period time. This may not be done when using a conventional power inductor.

The feed back converter used for shut down may for example be used to generate the required DC voltage level to pre charge capacitive elements with energy, which may be used for a start up sequence.

Figure 8:
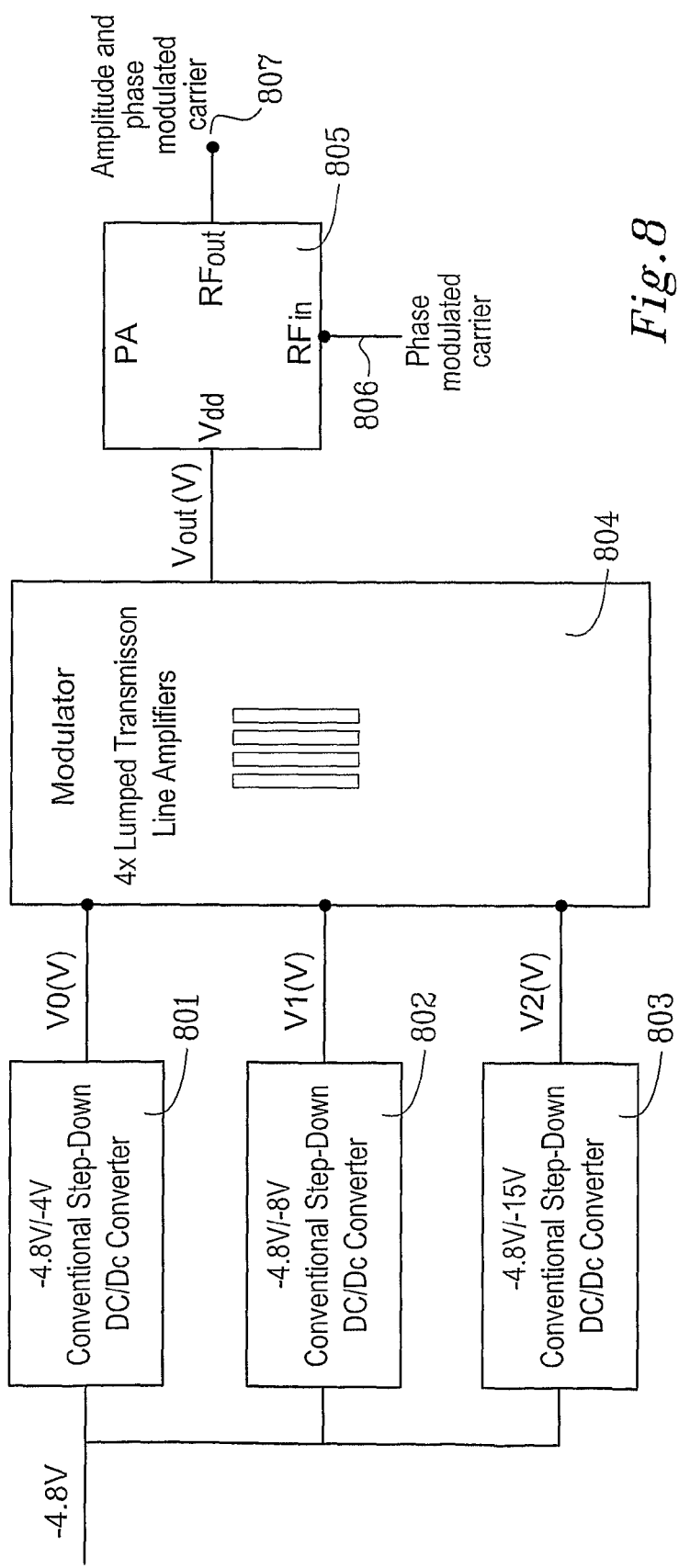
FIG. 8 illustrates schematically in a block diagram an embodiment of the present invention for a 3-bit 4-phase amplifier and RF PA.

FIG. 8 shows an application setup with a buck-boost derived amplifier 804 according to the present invention. The amplifier is used to provide a modulated voltage to a load. Conventional DC/DC converters 801, 802, 803 are used to provide a number of suitable (base) DC levels of voltages to an amplifier 804 according to the present invention which may combine the (base) DC voltages from the conventional converters to provide a suitable power to the load, in this case an RF module for providing an amplitude and phase modulated carrier 806, 807 in a communication device.

There are some advantages of using the solution as a buck-boost derived amplifier according to the present invention:

By using a transmission line (or similar wave propagating medium), with characteristic impedance equal to PA 805 supply impedance, all energy in inductive and capacitive components may be consumed each modulation cycle.

Rise- and fall time of output voltage is consequently limited to switch element turn on/off time and not the output filter characteristics of a conventional DC/DC converter.

Embodiments of the present invention providing a circular resonator transformer are shown in FIGS. 9-12. The transmission line 903, 1001, 1101, 1201 may be seen as a resonator and by connecting several resonators in a circular (FIGS. 10-12) or triangular (FIG. 9) loop and distribute the load 906 at at least two switched points 902, 904, 905 along this loop, a rotational standing wave in the circuit may be formed and maintained. By sequenced pulsing of the input power connector and at the POL around the network this may be started. Possibly the input switch 902 may remain closed after start-up and still maintain the standing wave. This will lead to an intermittent switch mode operation with reduced switch losses.

By generalizing the discussion above the triangular network may be seen as a circular disc and formed as shown in FIG. 10 with a circular disc 1001 with a hole 1002 in the central part of the disc. Shown in FIG. 11 is still another variation of this theme where the central hole may be omitted and thus is provided a resonant area. Optionally, this resonator may be fed from the centre. In still another variation of this solution shown in FIG. 12, by introducing a λ/3 delay line 1202 the 3rd bias switch may be omitted.

Optionally, any internal losses (and rotating bias) may be supplied by an external magnetic field thus maintaining the circular wave without input/output switching.

Using a solution operating with only over sampling mode, several different applications may be shown:
1. DC/AC converter OVS
2. Waveform generator OVS
3. AC/DC conversion OVS
4. Power factor correction OVS
5. Amplifier OVS
6. Continuous power amplifier OVS The power converters may also be operated by combining sub sampling (SUS) and over sampling (OVS) procedures, providing:
1. DC/AC converter SUS/OVS
2. Waveform generator SUS/OVS
3. AC/DC conversion SUS/OVS
4. Power factor correction SUS/OVS
5. Amplifier SUS/OVS
6. Continuous power amplifier SUS/OVS FIG. 13 shows a circuit that may be used as DC/AC converter, waveform converter, AC/DC conversion, and power factor correction using the OVS technique. The circuit comprises an electrical input 1301 connected to a first switch (or gate) S1 1302. Furthermore, a transmission line TL 1305 is connected in parallel to second switch S2 1303 in turn connected to a capacitance 1304. Both the transmission line and capacitance is connected to ground. An optional third switch is located between the transmission line and ground. Also connected to the second switch is an output 1307 connectable to a load. This circuit converts a DC voltage to an AC voltage with both positive and negative values (no DC component). Switch S1 1302 and S2 1303 is pulse width modulated with an appropriate pattern to maintain a sine wave output voltage. Switch S2 1303 is delayed 2td relative to switch S1 1302. Switch S1 1302 and S2 1303 operate at a high frequency (e. g. fsw=¼td). Switch S3 1306 sets the output voltage polarity and operates a magnitude lower in frequency than the frequency of switch S1 1302 and S2 1303.

Figure 13:
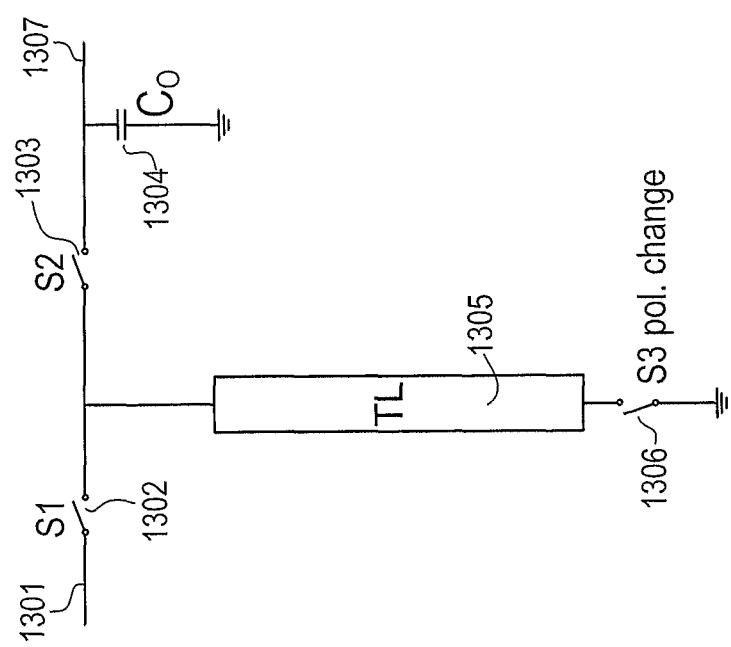
FIG. 13 illustrates schematically an embodiment of the present invention: OVS application.

The circuit described in FIG. 13 may also be used as a waveform generator but in this case it is pulse width modulated with a different pattern to generate an arbitrary output voltage waveform.

The same circuit may also be used to rectify the input AC voltage and optionally adjust the output voltage amplitude by changing the S1 1302 and S2 1303 switch duty cycle. Switch S2 1303 is delayed 2td relative to switch S1 1302. Switch S1 1302 and S2 1303 operate at a high frequency (e. g. fsw=¼td). Switch S3 1306 sets the output voltage polarity and operates a magnitude lower in frequency than the frequency of switch S1 1302 and S2 1303.

The circuit may also be used as an AC/DC converter, which simultaneously rectifies the input voltage 1301 and converts it to a DC output voltage. Switch S1 1302 and S2 1303 is pulse width modulated with an appropriate pattern to maintain a constant DC output voltage. Switch S2 1303 is delayed 2td relative to switch S1 1302. Switch S1 1302 and S2 1303 operate at a high frequency (e. g. fsw=¼td). Switch S3 1306 rectifies the input voltage 1301 and operates a magnitude lower in frequency than the frequency of switch S1 1302 and S2 1303. The normal technique for AC/DC conversion is to use a diode rectifier in series with a buck converter. If a half wave diode rectifier is used this requires a total number of 4 semiconductors. If the full input voltage shall be used it requires a full wave diode rectifier giving a total number of 6 semiconductors.

In yet another example of use of this circuit, a PWM controller continuously changes the S1 1302 and S2 1303 switch duty cycles to maintain an input sinusoid current regardless of load current in RLOAD. This is achieved by sensing the input voltage and current into a control feed back loop. The first converter (S1 1302, S2 1303, S3 1306, TL 1305, COUT 1304) has an unregulated intermediate output voltage VOUT_INT that is fed into a DC/DC converter located on the output of the circuit with a fixed output voltage VOUT_DC. Switch S2 1303 is delayed 2td relative to switch S1 1302. Switch S1 1302 and S2 1303 operate at a high frequency (e. g. fsw=¼td). Switch S3 1306 rectifies the input voltage 1301 and operates a magnitude lower in frequency than the frequency of switch S1 1302 and S2 1303.

It should be noted that the word "comprising" does not exclude the presence of other elements or steps than those listed and the words "a" or "an" preceding an element do not exclude the presence of a plurality of such elements. It should further be noted that any reference signs do not limit the scope of the claims, that the invention may be at least in part implemented by means of both hardware and software, and that several "means" or "units" may be represented by the same item of hardware.

The above mentioned and described embodiments are only given as examples and should not be limiting to the present invention. Other solutions, uses, objectives, and functions within the scope of the invention as claimed in the below described patent claims should be apparent for the person skilled in the art.

Abbreviations and Definitions
AC Alternating Current
Boost Step-up DC/DC converter, VIN_DC<VOUT_DC
Buck Step-down DC/DC converter, 0<VOUT_DC<VIN_DC
Buck-Boost Polarity inverting step-up/down DC/DC converter
D Duty cycle (%) of PWM signal
DA Digital/Analog
DC Direct Current
EER Envelope Elimination and Restoration
Lx Switch node in buck or boost converter circuits
LSB Least Significant Bit
OVS OVer Sampling
PA Power Amplifier
PFC Power Factor Correction
POL Point Of Load
PWM Pulse Width Modulator
QAM Quadrature Amplitude Modulation
TL Transmission Line
SUS SUb Sampling
UPS Uninterruptable Power Supply
WCDMA Wide Band Code Division Multiple Access

The invention claimed is:

1. An electrical power conversion device, comprising
at least one electrical source input;
at least two electrical gates;
at least one electrical wave propagation medium; and
at least one electrical output connectable to a receiving output load;
wherein the electrical source is configured to apply a voltage to the electrical wave propagation medium through a first gate for a time duration $2t_d$ exceeding the wave propagation time through the electrical wave propagation medium to one end of the electrical wave propagation medium and back to the electrical source, accumulating an electrical wave travelling in the electrical wave propagation medium, wherein a second gate is configured to control the resulting accumulated electrical wave at the electrical output, and wherein the first and second gates are in a conducting position substantially separated from each other in time.

2. The device according to claim 1, wherein the first and second gates are both located on the electrical source side of the electrical wave propagation medium.

3. The device according to claim 1, wherein the device is a power amplifier.

4. The device according to claim 1, wherein the device is one of a DC/DC converter, AC/DC converter, or DC/AC converter.

5. The device according to claim 1, wherein the device is a radio transmitter with a carrier wave generation and a mixer.

6. The device according to claim 1, wherein the device is a modulated amplifier comprising a plurality of electrical inputs each controlled by a corresponding gate connected to the electrical wave propagation medium.

7. The device according to claim 1, wherein the second gate is configured to be in a conducting state for a time duration shorter than $2t_d$.

8. The device according to claim 1, wherein the electrical wave propagation medium comprises at least one of a transmission line, a micro strip line, a printed circuit board track, or a substantially circular electrically conducting disc.

9. The device according to claim 1, wherein the receiving output load and the electrical output of the device have substantially matched impedances.

10. The device according to claim 1, wherein the receiving output load and the electrical output of the device have mismatched impedances.

11. The device according to claim 1, wherein each of the gates is one of an electrical switch or a diode.

12. The device according to claim 1, further comprising a third gate configured to provide polarity change of the electrical wave propagating in the device.

13. The device according to claim 12, wherein the third gate is configured to be in a conducting position for a time duration shorter than $2t_d$.

14. A method for converting electrical power using an electrical wave propagation medium, comprising the steps of:
providing an electrical source to the electrical wave propagation medium using a first gate;
providing the electrical source during a time exceeding the wave propagation time of the resulting electrical wave travelling in the electrical wave propagation medium to one end and back to the electrical source;
controlling the resulting electrical wave at an electrical output using a second gate;
wherein the first and second gates are in an on position substantially separated from each other in time.

15. A device for continuous power amplification, comprising a plurality of devices according to claim 1.

* * * * *

UNITED STATES PATENT AND TRADEMARK OFFICE
CERTIFICATE OF CORRECTION

| | |
|---|---|
| PATENT NO. | : 8,803,367 B2 |
| APPLICATION NO. | : 13/141317 |
| DATED | : August 12, 2014 |
| INVENTOR(S) | : Sander |

Page 1 of 1

It is certified that error appears in the above-identified patent and that said Letters Patent is hereby corrected as shown below:

In the Specification

In Column 1, Line 24, delete "AC/CD" and insert -- AC/DC --, therefor.

In Column 4, Lines 38-39, delete "transmitter;" and insert -- transmitter. --, therefor.

In Column 10, Line 41, delete "antenna The" and insert -- antenna. The --, therefor.

Signed and Sealed this
Twenty-sixth Day of May, 2015

Michelle K. Lee
*Director of the United States Patent and Trademark Office*